Dec. 13, 1966 R. E. LEE 3,292,005
HIGH-RESOLUTION SWITCHING CIRCUIT
Filed Sept. 23, 1963
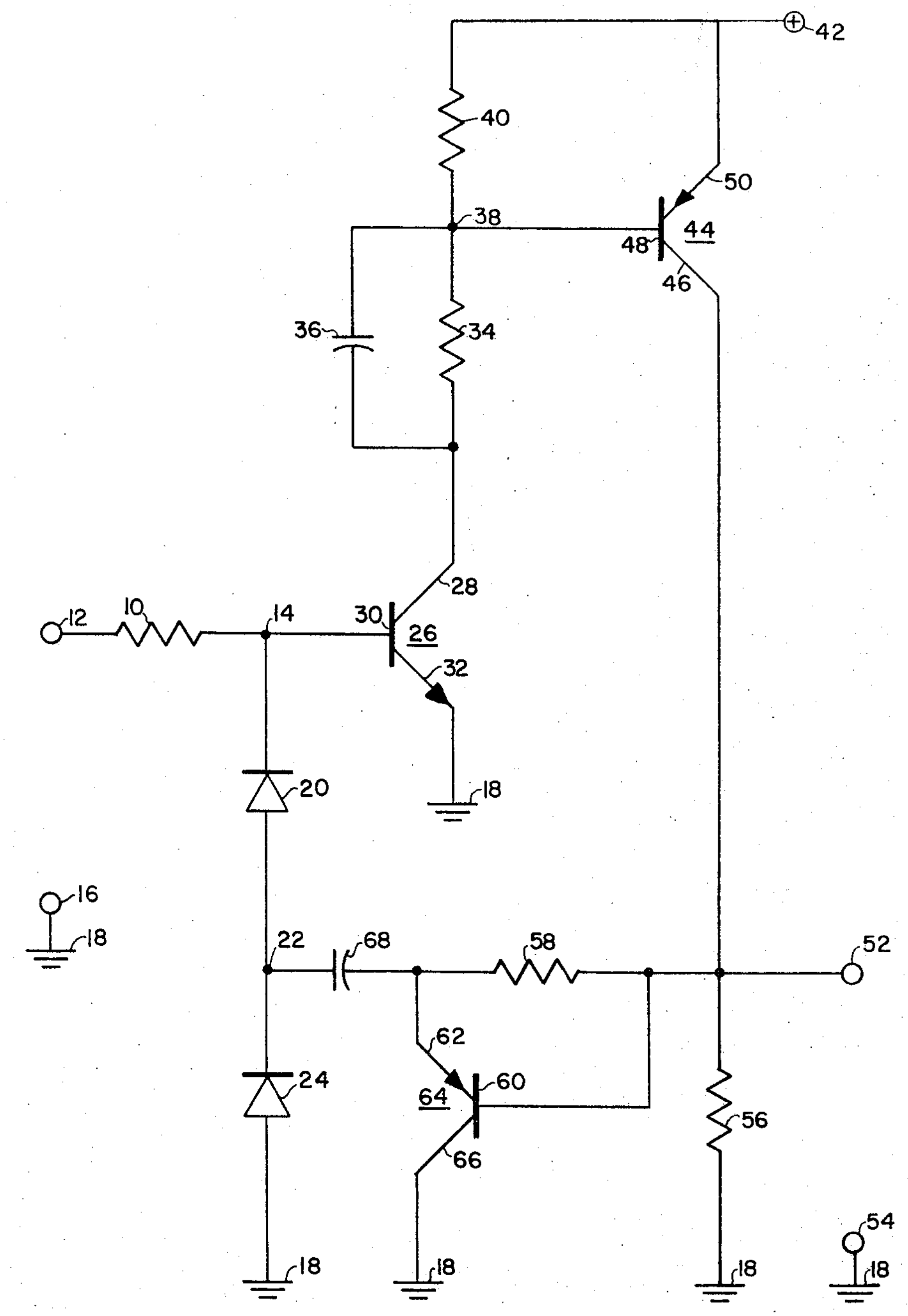
INVENTOR.
ROBERT E. LEE
BY Roger W. Jensen
ATTORNEY United States Patent Office 3,292,005
Patented Dec. 13, 1966

3,292,005
HIGH-RESOLUTION SWITCHING CIRCUIT
Robert E. Lee, Minneapolis, Minn., assignor to Honeywell Inc., a corporation of Delaware
Filed Sept. 23, 1963, Ser. No. 310,653
5 Claims. (Cl. 307—88.5)

This invention is related generally to switching circuits and is more particularly related to switching circuits wherein a time delay is incorporated during which the output signal will be maintained after the input signal reduces to a minimum amount. Even more specifically, this invention provides means whereby the switching circuit is reset in a minimum time period after the circuit turns OFF from its time delayed operation.

While the prior art has used switching circuits wherein an output signal is obtained for a predetermined amount of time after the input signal disappears, these circuits have had the disadvantage of requiring a long time constant for the time delay component, usually a capacitor, to permit further operation of the circuit. This type switching circuit is often designated a monostable multivibrator. Where a capacitor is used in providing a time delay, it is necessary that the capacitor discharge so as to make the circuit operable again. Since normally the capacitor discharges through the same resistor as it originally charges, a time delay equal to the original ON time delay is often necessary before repeat performance of the circuit can be obtained. The present invention incorporates a transistor or other switching means which discharges the time delay capacitor in a very short time so as to enable the circuit to again perform the time delay function a very short period of time subsequent to a prior operation. This time period between operations of the circuit has been defined as resolution and will be so used in this specification. A high resolution will mean a short time period or reset time. The circuitry is so constructed that the discharge transistor is only turned ON at substantially the same time or soon after the switching circuit has turned to an OFF condition.

It is an object of this invention to provide apparatus which minimizes the time between successive operations of a time delay switching circuit and thereby obtains high resolution.

Further objects and advantages of this invention will be apparent from a reading of the specification and appended claims along with the single figure which is a schematic diagram of the circuitry utilized in the invention.

A resistive or impedance means 10 is connected between an input terminal means 12 and a junction point 14. A second input terminal means 16 is connected to ground or reference potential 18. A diode, rectifying means or unidirectional conductor means 20 is connected between the junction point 14 and a junction point 22. A second rectifying means, diode means, or unidirectional conductor means 24 is connected between the junction point 22 and ground 18. The two diodes 20 and 24 are connected so as to permit a direction of easy current flow from ground 18 to junction point 14. While alternate terms are used for various components and portions of the circuit such as ground and diodes, a single term will be used throughout the rest of the specification for clarity although it is to be understood that each of the terms used is descriptive of and representative of the component or circuit portion described. A valve, switching means, current responsive means or NPN conductivity or polarity type transistor 26 having a collector 28, a base 30, and an emitter 32 has the emitter 32 connected to ground 18. The base 30 of transistor 26 is connected to junction point 14. A resistive means 34 is connected in parallel with a capacitive means 36 between a junction point 38 and collector 28. A resistive means or impedance means 40 is connected between junction point 38 and a positive power supply means or power terminal means 42. A PNP conductivity or polarity type transistor means, valve means, switching means, or current control means 44 has a collector 46, a base 48, and an emitter 50. The emitter 50 is connected to power supply means 42 while the base 48 is connected to junction point 38. The collector 46 is connected to an output terminal means 52. Another output terminal means 54 is connected to ground 18. A resistive means or impedance means 56 is connected between output terminal 52 and ground 18. A resistive or impedance means 58 is connected between a base 60 and an emitter 62 of a PNP transistor means, valve means, discharge means, switching means, or current control means 64 having a collector 66. The collector 66 is further connected to ground 18 while the base 60 is connected to output 52. A capacitive means, energy storing means, or impedance means 68 is connected between the junction point 22 and the emitter 62 of transistor 64. The transistors 26 and 44 may be referred to as complementary symmetry means of a switching means or amplifying means.

In the normal or quiescent condition of the apparatus, all transistors will be in an OFF condition and capacitor 68 will be discharged. Upon the application of a positive input pulse between terminals 12 and 16, transistor 26 will start to turn to ON. The lowered collector voltage of transistor 26 will start transistor 44 turning ON through the capacitive action of capacitor 36. Collector 46 will then rise in voltage towards the potential of power supply 42 and through the feedback action of resistor 58 in combination with capacitor 68 will regeneratively raise the base voltage of transistor 26 to turn ON transistors 26 and 44 more quickly. During and near the end of the regenerative action a positive pulse will appear at the output of terminals 52 and 54. Capacitor 68 will attempt to charge and in attempting to charge to the voltage placed across this capacitor will provide current to keep transistor 26 in an ON condition. When capacitor 68 is close to being fully charged, the base current to transistor 26 will decrease to an amount whereby transistor 26 will start turning to an OFF condition. This action again is regenerative and the turn OFF of transistor 44 will bring the output voltage back to near ground and the feedback action of capacitor 68 will also lower the base voltage of transistor 26. It may be assumed that the input signal at terminal 12 is only a very short duration pulse. With a short duration input, the ON time of transistors 26 and 44 and the resulting output signal at terminals 52 and 54 is a function of the capacity of capacitor 68 and the resistance of resistor 58. When the two transistors 26 and 44 have turned OFF, capacitor 68 will attempt to discharge. Without transistor 64 in the circuit, the discharge time would be approximately the same as the charge time and accordingly there would be a long interval after the turn OFF of the first two transistors before capacitor 68 would be completely discharged so as to enable a second full time ON condition of the circuit. With the addition of transistor 64, the discharge of capacitor 68 is greatly reduced in time since resistors 58 and 56 are bypassed. The discharge of capacitor 68 supplies current through resistor 58 to place the base 60 of transistor 64 at a negative potential with respect to emitter 62. This turns transistor 64 ON and supplies a short circuit between one terminal of capacitor 68 and ground 18. Since the only other component in the discharge path is diode 24, the discharge is accomplished in a minimum time period.

In one working embodiment of this circuit having 1500 microsecond width output pulses, the OFF time between pulses was reduced to approximately one microsecond. In this circuit diode 20 was used to prevent reverse voltage breakdown of transistor 26 and may not be required with some transistors having a higher base to emitter breakdown voltage. Also, the capacitor 36, which alters the turn ON characteristics of the circuit, may not be necessary in some applications.

While the operation of this circuit has been described as utilizing specific PNP and NPN transistors, it is to be realized that other polarity transistors can be used by merely reversing the power supply polarity. Other modifications such as an inductance in the feedback circuit and the use of other specific components will be readily recognized by those skilled in the art and I do not intend to be limited by the specifications as thus far presented but only by the appended claims.

What is claimed is:

1. Time delay switching circuitry for use where high resolution is desirable comprising, in combination:

first NPN transistor means including base, emitter and collector means;

reference potential means connected to said emitter means of said first transistor means;

input means connected to said base means of said first transistor means for supplying a positive input pulse thereto;

power supply means;

resistive means connected between said power supply means and said collector means of said first transistor means;

second PNP transistor means including base, emitter and collector means, said emitter means being connected to said power supply means;

means connecting said base means of said second transistor means to said collector means of said first transistor means for receiving signals therefrom;

output means connected to said collector means of said second transistor means third PNP transistor means including base, emitter and collector means, said base means and said collector means of said third transistor means being connected to said output means and said reference potential means respectively;

resistive means connected between said emitter means and said base means of said third transistor means; and capacitive means connected between said emitter means of said third transistor means and said base means of said first transistor means, said capacitive means supplying current to keep said first transistor means in an ON condition while said capacitive means is charging, and said capacitive means discharging through said third transistor means while said first transistor means is in an OFF condition.

2. Delayed action switching circuitry comprising, in combination:

first transistor means of a first conductivity type including base, emitter and collector means;

reference potential means connected to said emitter means of said first transistor means;

input means connected to said base means of said first transistor means for supplying an input signal thereto;

power supply means;

resistive means connected between said power supply means and said collector means of said first transistor means;

second transistor means of a second conductivity type including base, emitter and collector means, said emitter means being connected to said power supply means;

means connecting said base means of said second transistor means to said collector means of said first transistor means for receiving signals therefrom;

output means connected to said collector means of said second transistor means;

third transistor means of the second conductivity type including base, emitter and collector means, said base means and said collector means of said third transistor means being connected to said output means and said reference potential means respectively;

resistive means connected between said emitter means and said base means of said third transistor means; and capacitive means connected between said emitter means of said third transistor means and said base means of said first transistor means.

3. Time delay switching circuitry for use where high resolution is desirable comprising, in combination:

first transistor means including base, emitter and collector means;

power supply means having a first terminal means connected to said emitter means of said first transistor means;

input means connected to said base means of said first transistor means for supplying an input signal thereto;

resistive means connected between a second terminal means of said power supply means and said collector means of said first transistor means;

second transistor means including base, emitter and collector means, said emitter means being connected to the second terminal means of said power supply means;

means connecting said base means of said second transistor means to said collector means of said first transistor means for receiving signals therefrom;

output means connected to said collector means of said second transistor means for providing an output signal;

third transistor means including base, emitter and collector means, said base means and said collector means of said third transistor means being connected to said output means and the first terminal means of said power supply means respectively;

resistive means connected between said emitter means and said base means of said third transistor means; and capacitive means connected between said emitter means of said third transistor means and said base means of said first transistor means, said capacitive means discharging through said third transistor means.

4. Time delay switching circuitry for use where high resolution is desirable comprising, in combination:

first current responsive means including first, second and third means;

power supply means connected to said second means of said first current responsive means;

input means connected to said first means of said first current responsive means for supplying an input signal thereto;

resistive means connected between said power supply means and said third means of said first current responsive means;

second current responsive means including first, second and third means, said second means being connected to said power supply means;

means connecting said first means of said second current responsive means to said third means of said first current responsive means for receiving signals therefrom;

output means connected to said third means of said second current responsive means for providing an output signal;

third current responsive means including first, second and third means, said first means and said third means of said third current responsive means being connected to said output means and said power supply means respectively;

resistive means connected between said second means and said first means of said third current responsive means; and impedance means connected between said second means of said third current responsive means and said first means of said first current responsive means, any energy in said impedance means discharging through said third current responsive means.

5. High resolution time delay switching circuitry comprising, in combination:

first current responsive means including first, second and third means;

input means connected to said first means of said first current responsive means for supplying an input signal thereto;

power supply means connected to said second means of said first current responsive means;

first resistive means connected between said power supply means and said third means of said first current responsive means;

second current responsive means including first, second and third means, said first means connected to said power supply means;

means connecting said second means of said second current responsive means to said third means of said first current responsive means for receiving signals therefrom;

output means connected to said third means of said second current responsive means for providing an output signal;

capacitive means;

second resistive means;

means connecting said capacitive means and said second resistive means in series and further connecting one end of said capacitive means to said first means of said first current responsive means and the remaining end of said second resistive means to said output means, the series combination of said capacitive means and said second resistive means controlling the duration of the output signals; and means connected in electrical parallel with said second resistive means for discharging said capacitive means.

References Cited by the Examiner

UNITED STATES PATENTS

| | | | |
|---|---|---|---|
| 2,770,732 | 11/1956 | Chong | 307—88.5 |
| 2,827,574 | 3/1958 | Schneider | 307—88.5 |
| 3,016,468 | 1/1962 | Moraff | 307—88.5 |
| 3,025,417 | 3/1962 | Campbell | 307—88.5 |
| 3,033,998 | 5/1962 | Nellis | 307—88.5 |
| 3,065,362 | 11/1962 | Benson | 307—88.5 |
| 3,184,604 | 5/1965 | Hale | 307—88.5 |
| 3,193,701 | 7/1965 | Lawhon | 307—88.5 |

ARTHUR GAUSS, *Primary Examiner.*

J. ZAZWORSKY, *Assistant Examiner.*